United States Patent
Takeuchi

[19]

[11] Patent Number: 5,940,704
[45] Date of Patent: Aug. 17, 1999

[54] METHOD OF MANUFACTURING A REFERENCE APPARATUS

[75] Inventor: Nobuyoshi Takeuchi, Tokyo, Japan

[73] Assignee: NKK Corporation, Tokyo, Japan

[21] Appl. No.: 08/890,440

[22] Filed: Jul. 9, 1997

Related U.S. Application Data

[62] Division of application No. 08/565,168, Nov. 30, 1995, Pat. No. 5,684,739.

[30] Foreign Application Priority Data

| Nov. 30, 1994 | [JP] | Japan | 6-296304 |
| Apr. 27, 1995 | [JP] | Japan | 7-103657 |
| Oct. 26, 1995 | [JP] | Japan | 7-279107 |

[51] Int. Cl.$^6$ ............................................. H01L 21/336
[52] U.S. Cl. ......................................... 438/257; 438/275
[58] Field of Search ................................... 438/257, 275, 438/277, 278, 279, 283

[56] References Cited

U.S. PATENT DOCUMENTS

| 4,223,394 | 9/1980 | Pathak . | |
| 4,811,291 | 3/1989 | de Ferron | 365/185.2 |
| 4,833,514 | 5/1989 | Esquivel et al. . | |
| 5,068,697 | 11/1991 | Noda et al. . | |
| 5,163,021 | 11/1992 | Mehrota et al. | 365/185.03 |
| 5,465,231 | 11/1995 | Ohsaki | 257/315 |
| 5,776,787 | 7/1998 | Keshtbod | 438/257 |
| 5,817,556 | 10/1998 | Sasaki | 438/257 |

OTHER PUBLICATIONS

'94 Symposium on VLSI Technology pp. 97–98 Kobayashi et al "Memory Array Architecture and Decoding Scheme for 3V Only Sector Erasable DINOR Flash Memory".

'93 Symposium on VLSI Technology pp. 83–84 Ong et al "Erratic Erase in ETOX ™ Flash Memory Array".

IEDM 91–307, 11.4.1–11.4.4 Yamada et al "A self–convergence Erasing Scheme for a Simple Stacked Gate Flash EEPROM".

*Primary Examiner*—Joni Chang
*Attorney, Agent, or Firm*—Nixon & Vanderhye P.C.

[57] ABSTRACT

A reference apparatus for determining a current or voltage of a semiconductor device, includes a plurality of reference cells having threshold values different from each other, and a selection circuit for selecting one of the plurality of reference cells. A current flowing in a semiconductor device can be determined by comparing the current flowing in the reference apparatus, with the current flowing in a semiconductor cell by means of a sense amplifier.

2 Claims, 6 Drawing Sheets

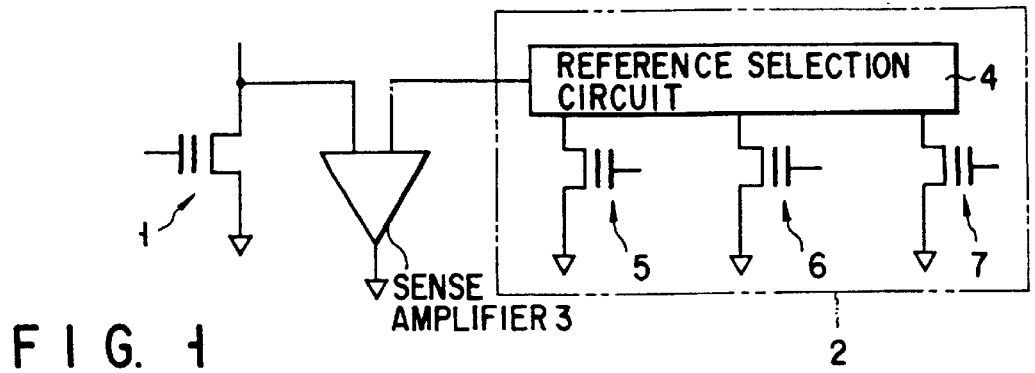
FIG. 1
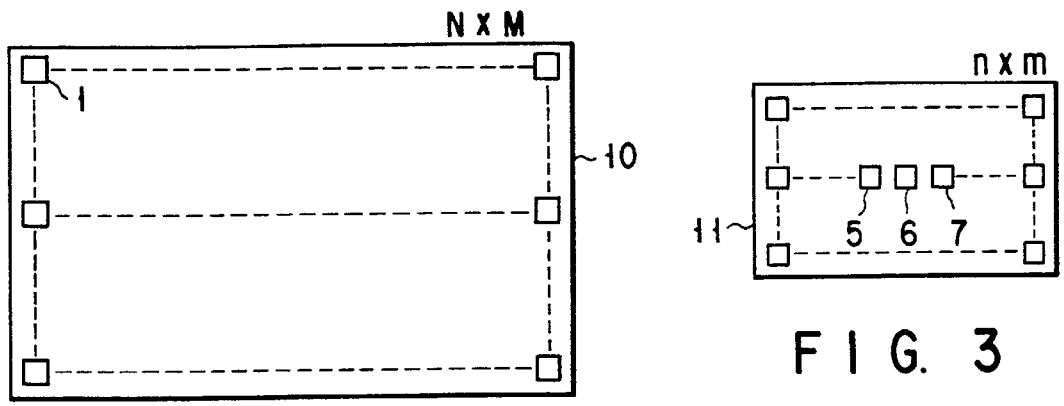
FIG. 2
FIG. 3
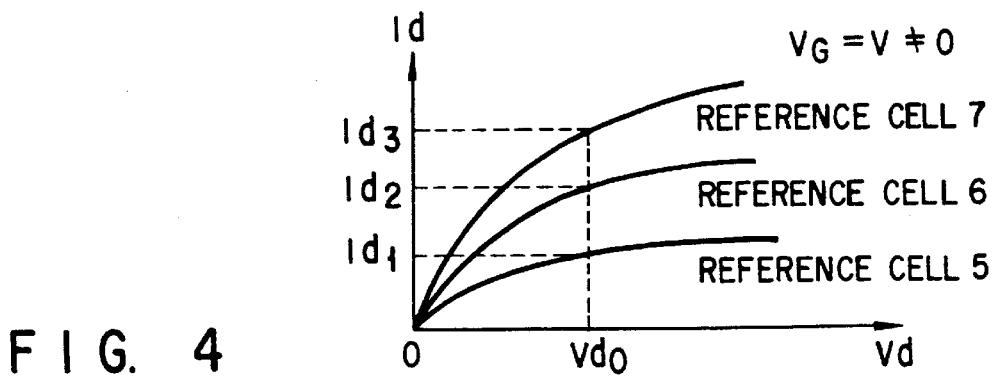
FIG. 4
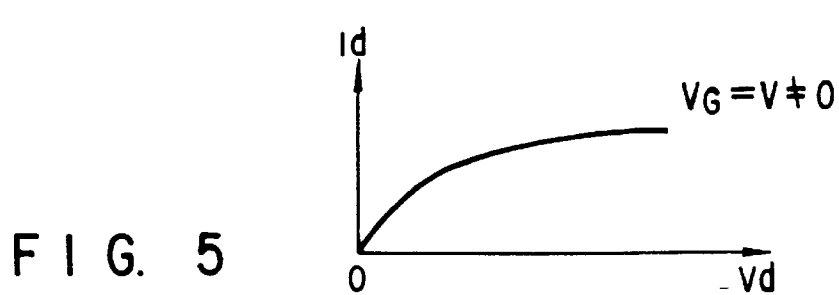
FIG. 5

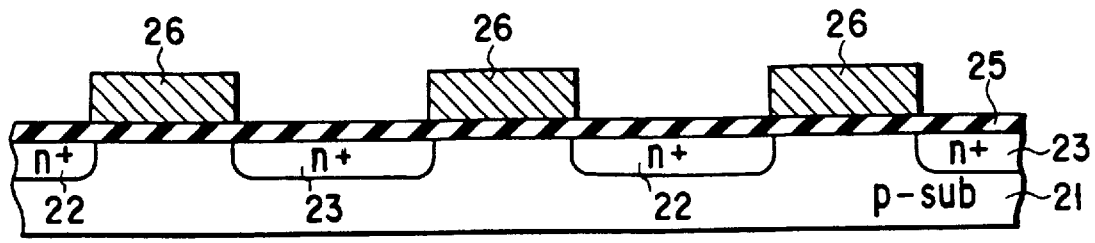
F I G. 9A
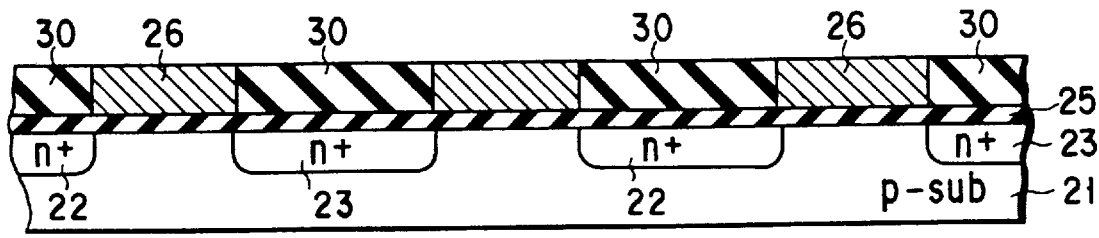
F I G. 9B
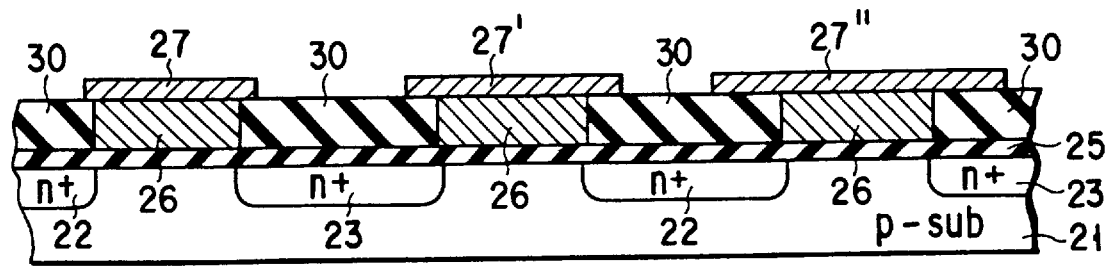
F I G. 9C
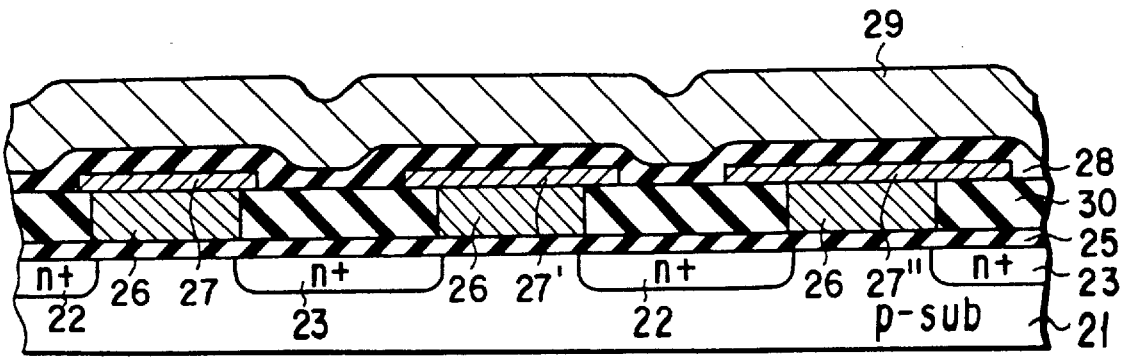
F I G. 9D

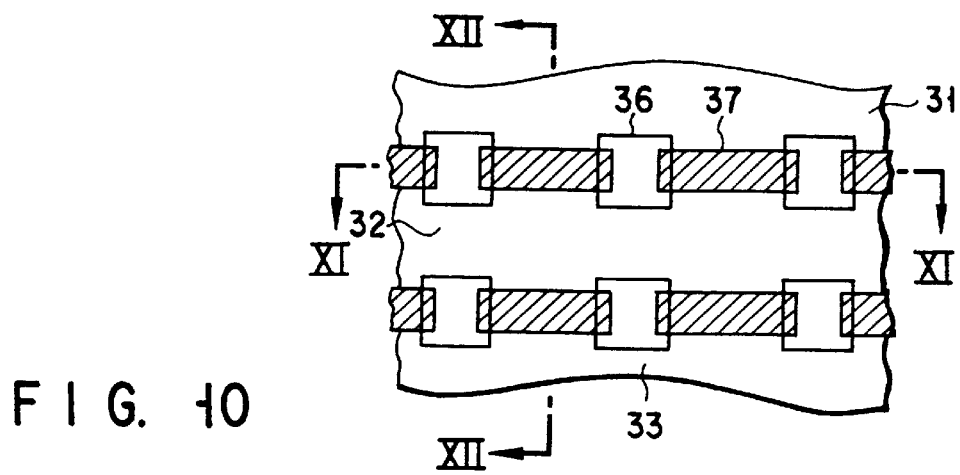
F I G. 10
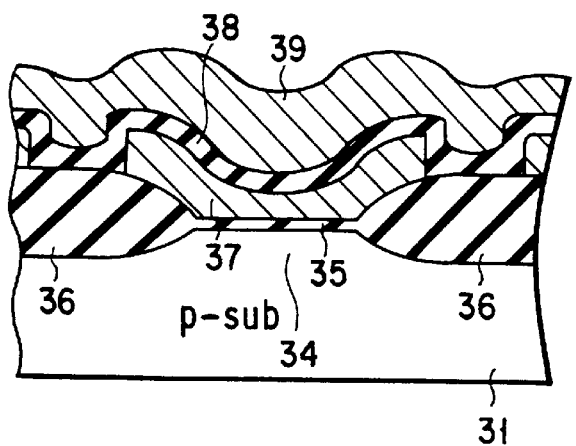
F I G. 11
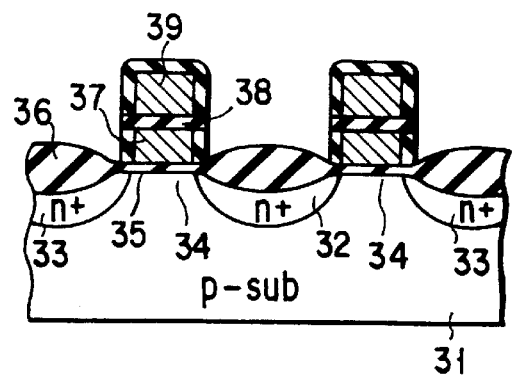
F I G. 12
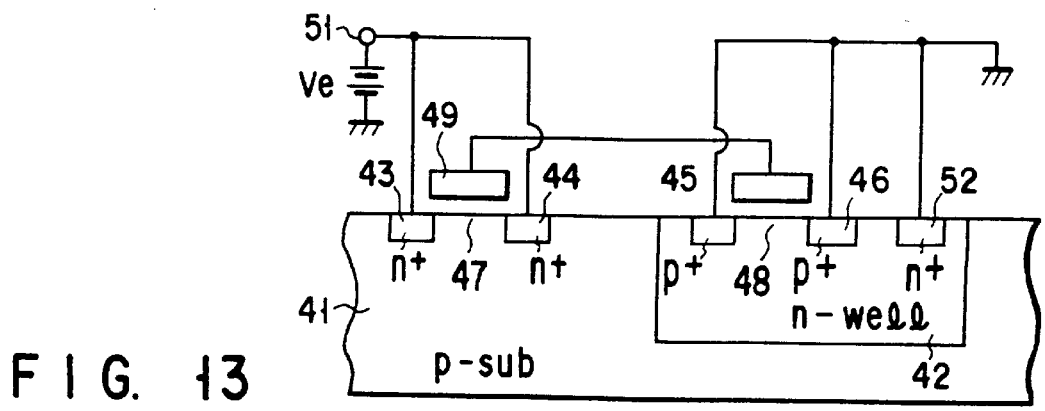
F I G. 13

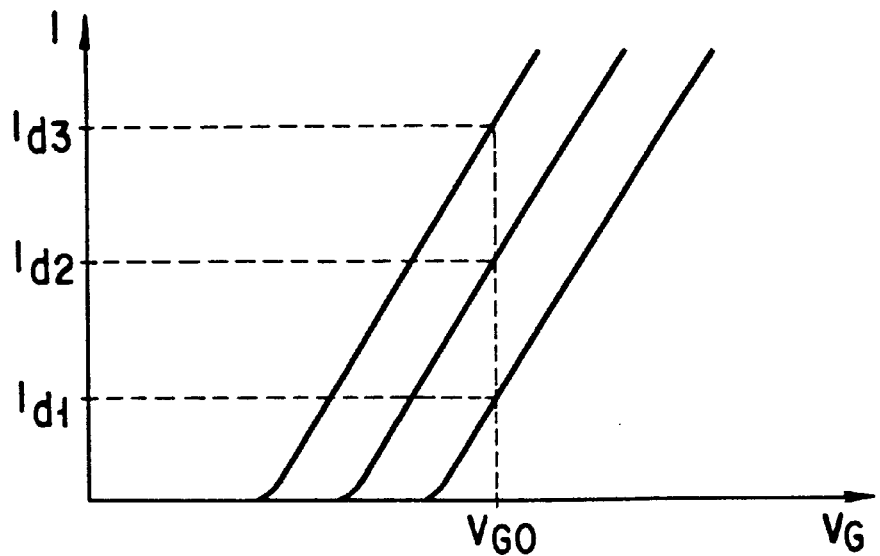
F I G. 17
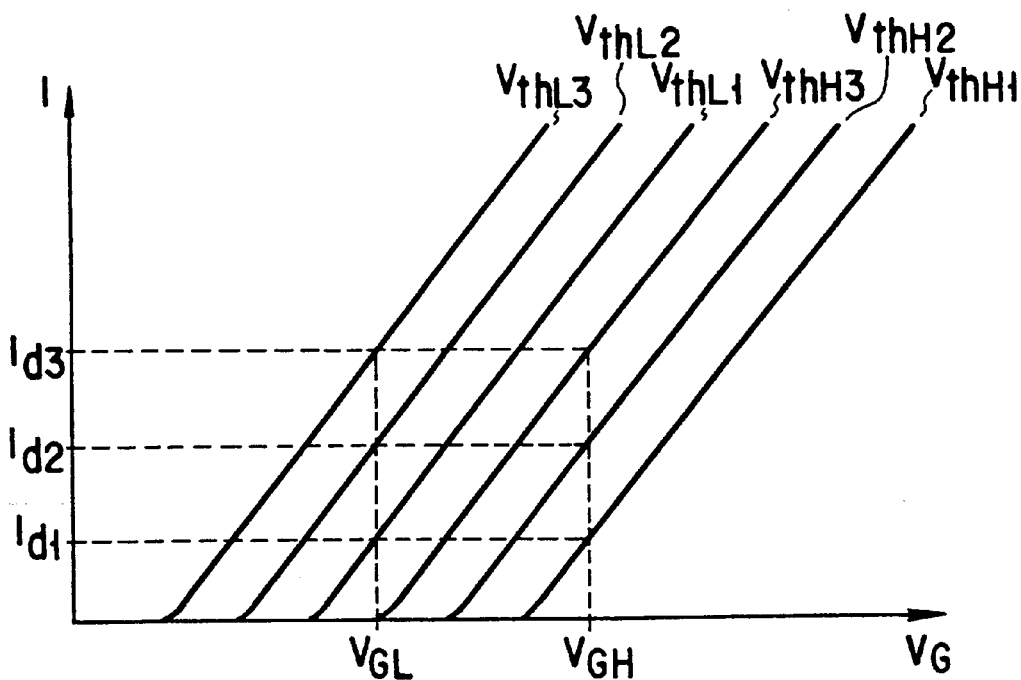
F I G. 18

METHOD OF MANUFACTURING A REFERENCE APPARATUS

This is a division of application Ser. No. 08/565,168, filed Nov. 30, 1995, U.S. Pat. No. 5,684,739.

BACKGROUND OF THE INVENTION

1. Field of the Invention

The present invention relates to a reference apparatus used for determining a current or a voltage of a semiconductor device such as a floating gate type non-volatile memory, a method of manufacturing such a reference apparatus, and a verifying method using such an apparatus.

2. Description of the Related Art

In a floating gate type non-volatile semiconductor memory device, a current flowing in a cell under predetermined conditions and a current flowing to a reference transistor are compared by a differential amplifier so as to determine cells in an array by "0" and "1". This reference transistor is called reference cell.

Such a reference cell is generally formed to have the same structure as that of an array cell for the purpose of maintaining a similarity with respect to the cell in array, or into a so-called dummy cell type in which the control gate and the floating gate are connected to each other. In short, a reference cell array serves as a miniature version of cell array.

Also, in a reference which determines an output of a logic device, the reference level is generally limited to the threshold value of the transistor used in the logic device.

Recently, in accordance with divergence in the characteristics of devices, it becomes necessary to make determination in terms of "0", "0.5" and "1" as in the case of, for example, a multi-value memory.

With a conventional approach, in reply to such a demand, a plurality of sense amplifiers having different sense ratios are used to deal with the divergence of devices, that is, a multiplicity in value.

However, with this approach, the circuit area is increased, thereby increasing the chip area and the cost.

For verification in which the threshold value of the memory cell after programming or erase is confirmed, the non-volatile semiconductor memory device changes Its verifying voltage in accordance with the state to be verified. However, when a verification is carried out in the above-mentioned manner, the voltage supply circuits are inevitably complicated.

SUMMARY OF THE INVENTION

An object of the present invention is to provide a reference apparatus capable of dealing with the divergence of devices without creating the above-described problem.

Another object of the present invention is to provide a verifying method capable of verifying memory cells without performing complicated voltage setting with use of the above reference apparatus.

According to the first aspect of the present invention, there is provided a reference apparatus for determining a current or voltage of a semiconductor device, comprising a plurality of reference cells having threshold values different from each other; and a selection circuit for selecting one of the plurality of reference cells.

According to the second aspect of the present invention, there is provided a reference apparatus for determining a current or voltage of a semiconductor device, comprising: a plurality of reference cells having threshold values different from each other; and a selection circuit for selecting one of the plurality of reference cells, wherein each of the reference cells includes: a semiconductor substrate of a first conductivity type, having a main surface; a source and a drain, of a second conductivity type, formed in the main surface, a channel region being defied in the main surface between the source and drain; a floating gate formed via an insulation film on the channel region, a conductive cap continuously provided on the floating gate so as to project therefrom, and a control gate formed via an insulation film on the conductive cap, the plurality of reference cells differing from each other in the area of the conductive cap.

According to the third aspect of the present invention, there is provided a method of manufacturing a reference apparatus for determining a current or voltage of a semiconductor device, including a plurality of reference cells having threshold values different from each other, and a selection circuit for selecting one of the plurality of reference cells, the method comprising the steps of:

forming a first insulation film on a main surface of a semiconductor substrate of a first conductivity type;

forming a first conductive film which gives rise to floating gates of the reference cells, on the first insulation film;

forming a floating gate of each of the reference cells by etching the first conductive film;

forming diffusion regions which give rise to drains and sources of the reference cells, in the main surface of the semiconductor substrate;

forming second insulation films between the floating gates;

forming second conductive films which give rise to conductive caps of the reference cells, on the floating gates and the second insulation films of the reference cells;

etching the second conductivity films by photolithography with use of a mask having a plurality of opening portions having different areas, which correspond to the conductive caps of the reference cells, thus forming conductive caps having different areas from one reference cell to another, so as to project from the floating gates;

forming a third insulation film on the second insulation films and the conductive caps; and forming a third conductive film which gives rise of control gates, on the third insulation film.

According to the fourth aspect of the present invention, there is provided a method of manufacturing a reference apparatus for determining a current or voltage of a semiconductor device, including a plurality of reference cells having threshold values different from each other, and a selection circuit for selecting one of the plurality of reference cells, the method comprising the steps of:

forming a first insulation film on a main surface of a semiconductor substrate of a first conductivity type;

forming a first conductive film which gives rise to floating gates of the reference cells, on the first insulation film;

etching the first conductivity film by photolithography with use of a mask having a plurality of opening portions having different areas, which correspond to the floating gates of the reference cells, thus forming floating gates having different areas from one reference cell to another;

forming diffusion regions which give rise to drains and sources of the reference cells, in the main surface of the semiconductor substrate;

forming second insulation films between the floating gates;

forming third insulation films on the second insulation films and the floating gates; and forming a second conductive film which gives rise of control gates, on the third insulation film.

According to the fifth aspect of the present invention, there is provided a reference apparatus for determining a current or voltage of a semiconductor device, comprising: a plurality of reference cells having threshold values different from each other; and a selection circuit for selecting one of the plurality of reference cells, wherein each of the plurality of reference cells has a 1-poly-type EPROM structure including a semiconductor substrate having a main surface, a reading transistor portion and a control gate portion formed in the main surface, a common floating gate provided above the reading transistor portion and the control gate portion, and a ratio between the area in the control gate portion, in which the floating gate and an active region overlap with each other, and the area in the reading transistor portion, in which the floating gate and an active region overlap with each other, differs from one reference cell to another.

According to the sixth aspect of the present invention, there is provided a verifying method using the reference apparatus for determining a current or voltage of a semiconductor device, which includes a plurality of reference cells having threshold values different from each other, and a selection circuit for selecting one of the plurality of reference cells, the method comprising the steps of applying a constant voltage to the plurality of reference cells and memory cells, and comprising a current of a semiconductor device obtained upon the application of the voltage with a current of each of the reference cells to perform a verification.

With the reference apparatus according to the first aspect of the invention, one of a plurality of reference cells having different threshold values is selected by the selection circuit, and the selected reference cell is used for determination of a cell. Therefore, the present invention is capable of dealing with the diversity of devices without using a plurality of sense amplifiers.

With the reference apparatus according to the second aspect of the invention, conductive caps are provided continuously on the floating gates so as to be project from the floating gates and to have different areas from one reference cell to another, and therefore each of the reference cells can be prepared with a different capacitance between the floating gate integrated with the conductive cap and the control gate. Thus, reference cells having different threshold values can be prepared without adding any complicated steps.

Further, with the manufacturing methods of the reference apparatus according to the third and fourth aspects of the invention, a single mask with openings having different sizes is used, and therefore the area of the floating gate or of the conductive cap continuously provided thereon, can be made different from one reference cell to another. Therefore, reference calls having different threshold values can be prepared by means of simple steps.

With the reference apparatus according to the fifth embodiment, in each of a plurality of reference cells has a 1-poly-type EPROM structure including a semiconductor substrate having a main surface, a reading transistor portion and a control gate portion formed on the main surface, a common floating gate provided above the reading transistor portion and the control gate, the ratio between the area in the control gate portion, in which the floating gate and an active region overlap with each other, and the area in the reading transistor portion, in which the floating gate and an active region overlap with each other, is made different from one reference cell to another. Therefore, the gate couple ratio can be made different from one reference cell to another. Thus, reference cells having different threshold values can be prepared without adding any complicated steps.

With the verifying method according to the sixth aspect of the invention, the difference in the threshold value between reference cells can be substituted by the difference in the verifying voltage, and therefore it is no longer necessary to carry out a complicated voltage setting.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a diagram showing the structure of a determining circuit in which a reference apparatus according to the first embodiment of the present invention is provided;

FIG. 2 is a schematic diagram showing an example of a semiconductor cell array in which the reference apparatus is applied;

FIG. 3 is a schematic diagram showing a reference array in which the reference apparatus of the present invention is applied;

FIG. 4 is a characteristic diagram showing the V-I characteristics of the reference apparatus according to the embodiment;

FIG. 5 is a characteristic diagram showing the V-I characteristics of a semiconductor cell in which the reference apparatus according to the embodiment is applied;

FIGS. 9A to 9D are diagrams illustrating the method of manufacturing a plurality of reference cells having different threshold values from each other;

FIG. 10 is a plan view showing another example of the structure of the reference cell used in the reference apparatus of the present invention;

FIG. 11 is a cross sectional view taken along the line XI—XI of FIG. 10;

FIG. 12 is a cross sectional view taken along the line III—XII;

FIG. 13 is a plan view showing still another example of the structure of the reference cell used in the reference apparatus of the present invention;

FIG. 17 is a diagram illustrating the verifying method of the present invention, in which the reference apparatus is used; and FIG. 18 is a diagram illustrating the verifying method of the present invention is carried out with use of a plurality of verifying voltages.

DETAILED DESCRIPTION OF THE PREFERRED EMBODIMENTS

Figure 6:
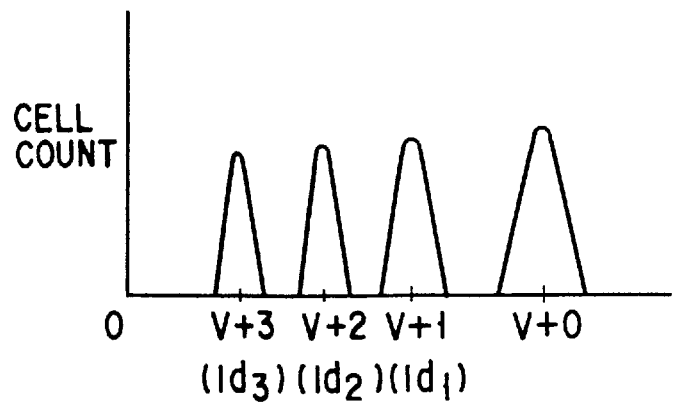
FIG. 6 is a diagram showing an example of the distribution of threshold values of cells in the case of program low.

Embodiments of the present invention will now be described with reference to drawings.

FIG. 1 is a diagram showing the structure of a determining circuit in which a reference apparatus according to the first embodiment of the present invention is provided.

This circuit includes a semiconductor cell 1 to be judged, a reference apparatus 2 and a sense amplifier (differential amplifier) 3 connected to these members. The sense amplifier 3 compares a current flowing in the cell 1 and a current flowing in the reference apparatus with each other, under predetermined conditions.

The reference apparatus 2 includes a reference selection circuit 4 and three reference cells 5, 6 and 7 having different threshold values, and either one of the reference cells 5, 6 and 7 is selected by the reference selection circuit 4. These reference cells are semiconductors having the same type of the semiconductor cell 1, and are formed within a cell array.

A plurality of semiconductor cells 1 are arranged to form a cell array 10 as shown in FIG. 2, and the reference cells 5, 6 and 7 form a reference cell array as shown in FIG. 3.

For example, non-volatile semiconductor memories are used as the cells 1, and the same type of semiconductors are used as the reference cells 5, 6 and 7 of the reference apparatus 2, which is used for verification of a program. Further, as shown in FIG. 4, for a verification voltage $V_{d0}$, a cell which stop the execution of the program when the current becomes $I_{d1}$, a cell which stop the execution of the program when the current becomes $I_{d2}$ and a cell which stop the execution of the program when the current becomes $I_{d3}$ are respectively assigned to reference cells 5, 6 and 7. With this structure, a multi-value memory for four reference levels which can be set by a cell which has not been programmed, a call for $I_{d1}$ a cell for $I_{d2}$ and a cell for $I_{d3}$, can be formed. In other words, the present invention can deal with a multi-value memory without increasing the circuit area, which is caused by using a plurality of sense amplifiers.

FIG. 5 shows the I-d characteristics of a semiconductor cell thus obtained. FIG. 6 shows an example of the distribution of threshold values of cells in the case of the program low.

The term of "program low" means a program operation to make the threshold voltage of a memory cell law or the status in which the threshold voltage thereof comes to be low after such a program operation. (See "'94 Symposium on VLSI Technology" pp 97–98.) According to a typical example described in the paper, in the program operation, −8V is applied to the selected word line, and 5V or 0V is applied to the drain. If 5V is applied, electron ejection from the floating gate to the drain occurs, and the threshold voltage of the memory cell becomes low.

FIG. 6 is an example of the case where the program low is carried out after the data have been erased all at once by a time Node without verification. In the case where the verification of $V_{+1}$ is performed with reference to $I_{d1}$, the program level would be of three references, namely, $V_{+1}$ corresponding to $I_{d2}$ and $V_{+2}$ corresponding to $I_{d3}$ in addition to the above.

Next, an example of the structure of a reference cell will now be described.

Figure 7:
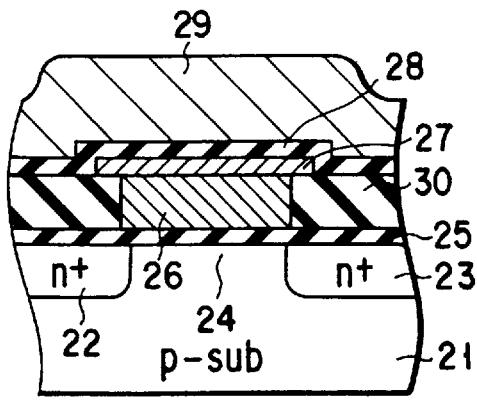
FIG. 7 is a cross sectional diagram showing an example of the structure of a reference cell which is used in the reference apparatus of the present invention.

A poly-Si cap-type floating gate cell is used in this example. The poly-Si cap-type floating gate cell is discussed in U.S. Pat. No. 4,833,514, and has the structure such as shown in FIG. 7. More specifically, an n-type source 22 and an n-type drain 23 are formed on the main surface of a p-type substrate 21, and a poly-Si floating gate 26 is formed via a gate insulation film 25 on a channel region 24 between the source and drain. Further, a poly-Si cap 27 is formed on the floating gate. A control gate 29 made of poly-Si is formed on the poly-Si cap 27 via an interlevel dielectric layer 28 made of, for example, ONO (oxide-nitride-oxide). An insulation layer 30 is formed on a side of the floating gate 26.

The floating gate 26 is provided so as to cover the channel region 24, and the poly-Si cap 27 formed on the floating gate is formed to have the shape of a hood-roof which covers, partially or entirely, the source 22 and the drain 23, or a part of an element separation region such as a field oxide film. The poly-Si cap 27 serves as a part of the floating gate 26. With the poly-Si cap 27 provided, the capacitance between the floating gate and the control gate can be increased.

The threshold value of a reference cell can be controlled by varying the gate couple ratio, which can be adjusted by changing the capacitance between the floating gate and the control gate. Therefore, in the above-described structure, the threshold value can be changed by varying the area of the poly-Si cap 27, and the area in which the poly-Si cap 27 and the control gate 29 overlap with each other.

Figure 8A:
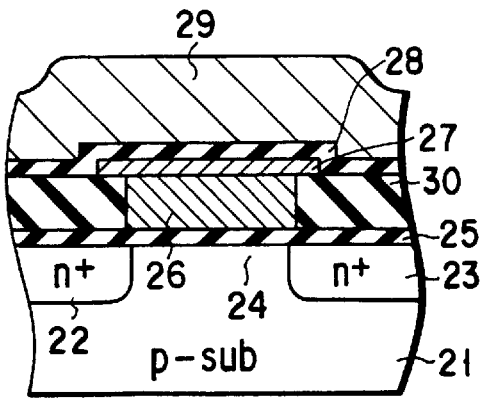
FIGS. 8A to 8C are diagrams showing examples of the reference cell shown FIG. 7, in which the threshold values are different from each other.
Figure 8B:
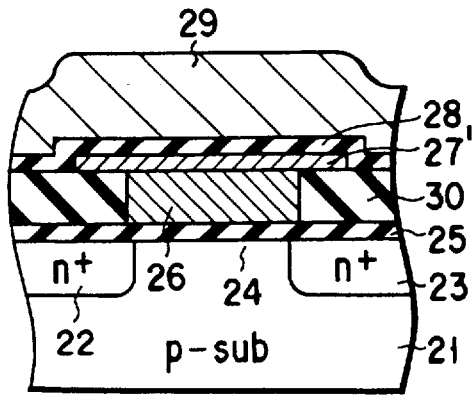
Figure 8C:
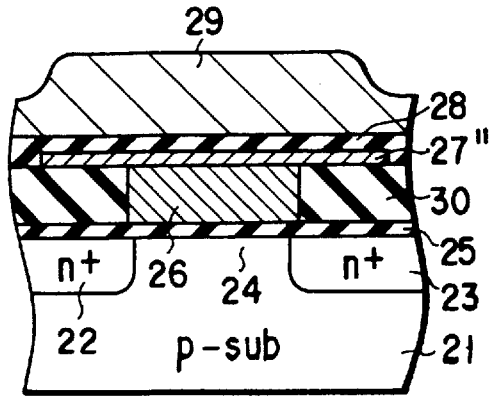

For example, as shown in FIGS. 8A to 8C, by assigning three different areas for the poly-Si cap, the threshold of the reference cell can be set at three reference levels. That is, the reference cell having such a poly-Si cap 27 as shown in FIG. 8A is assigned to the above reference cell 5, and those cells including poly-Si caps 27' and 27", respectively, which are made longer (that is, wider in area) than that of the above, as shown in FIGS. 8B and 8C, are assigned to the reference cells 6 and 7.

An example of the process for the manufacture of these reference cells will now be described with reference to FIGS. 9A to 9D.

First, a gate insulation film made of, for example, silicon oxide, is formed on a main surface of a p-type substrate 21, and a first poly-silicon film for floating gate is formed on it. The first poly-Si film is etched by a conventional photolithography process, and floating gates 26 corresponding to the reference cells are formed. Next, with ion implantation, the source 22 and the drain 23 for each of the reference cells are formed in the main surface of the semiconductor substrate 21 (See FIG. 9A).

Next, after forming an insulation film on the entire surface, the surface is etched back, thus obtaining an insulation film 30 made of, for example, silicon oxide between the floating gates 26 of adjacent reference cells (see FIG. 9B).

Subsequently, a second poly-Si film is formed, and the second poly-Si film is etched by photolithography with use of a mask having a plurality of opening portions with different lengths (areas) each corresponding to the poly-Si cap of a respective reference cell. Thus, conductive caps 27, 27' and 27" having different areas from each other are formed in the reference cells so as to protrude from the floating gates 26 thereof (see FIG. 9C).

Next, an interlevel dielectric layer 28 made of, for example, ONO (oxide-nitride-oxide) is formed on the insulation film 30 and the poly-Si caps 27, 27', 27", and a third poly-Si film which serves as control gate 29 is formed thereon (see FIG. 9D).

With the above-described process, a plurality of reference cells having threshold values different from each other can be formed.

As described above, in the photolithography step for processing poly-Si caps, a plurality of reference cells having different threshold values can be prepared by use of a very general thin film forming technique and a very general photolithography technique without adding any complicated step, but by merely forming patterns of the poly-Si caps having different lengths (areas) in a mask. More specifically, with a simple process such as to improve a mask by forming patterns having different sizes in the stage of reticle, the reference cells can be formed to have different threshold values.

The above-described cells have a structure in which a poly-Si cap is provided on a floating gate; however it is also possible that such a cap is not provided, but the floating gate itself is formed to have the function of poly-Si cap. Cells having the above-described structure are illustrated in FIGS. 10 to 12. FIG. 10 is a plan view showing a portion of a cell array consisting of cells having the above-described structure, FIG. 11 is a cross section taken along the line XI—XI indicated in PIG. 10, and FIG. 12 is a cross section taken along the line XII—XII indicated in FIG. 10. As illustrated in these figures, in each of these cells, the floating gate 37 is formed so as to cover a portion of the source 32, a portion of the drain 33, and a portion of the element separation region 36. The structure of each cell is illustrated in detail in FIGS. 11 and 12. As can be seen in these figures, the n-type source 32 and the n-type drain 33 are formed in the main surface of the p-type substrate 31, and the gate insulation film 35 is formed on the a channel region 34 provided between the source and drain. A poly-Si floating gate 37 is formed on the gate insulation film 35, and a control gate 39 made of poly-Si is formed on top of that, via an interlevel dielectric layer 38 made of, for example, ONO (oxide-nitride-oxide). These cells are separated from each other by the element separation region 36.

With regard to the cell having the above-described structure, the threshold value of the cell can be controlled by varying the gate couple ratio, which can be adjusted by changing the capacitance between the floating gate and the control gate. The adjustment of the capacitance can be performed by varying the area in which the floating gate 37 and the control gate 39 overlap with each other. In the case where the floating gates are formed, it only suffices if a mask having a plurality of opening portions with different lengths (areas) each corresponding to the floating gate of a respective reference cell, is provided, and there is no need to use other complicated means than the above.

More specifically, first, a gate insulation film made of, for example, silicon oxide, is formed on a p-type substrate 31, and a first poly-Si film which serves as a floating gate is formed on it. Then, with use of a mask having a plurality of opening portions with different lengths (areas) each corresponding to the floating gate of a respective reference cell, the first poly-Si film is etched by photolithography, thus forming floating gates having different areas from one reference cell to another.

After that, a diffusion region, an insulation film between floating gates, an interlevel dielectric film and a control gate are formed by means of conventional steps, and thus a plurality of reference cells having different threshold values can be formed.

The width of the control gate may be changed in order to vary the capacitance between the floating gate and the control gate. This embodiment was discussed in connection with the case where each floating gate is extended in the direction vertical to the direction in which the sources and drains are disposed; however each floating gate may naturally be formed to be extended in the direction in which the sources and drains are arranged.

Next, another example of the structure of the reference cell will now be described with reference to FIG. 13. This example was discussed in VLSI symposium 52-A, 1993, and in this example, 1 poly-type EPROM is used as a reference cell of a logic device. In this cell, an n-well 42 is formed on a part of a p-type substrate 41. Further, an $n^+$-type source 43 and an $n^+$-type drain 44 are formed in a portion other than the part in which the n-well 42 is formed, and a source 45 and a drain 46 are formed in the part of the n-well 42. On channel regions 47 and 48 formed therebetween, common floating gates 49 are formed via a gate oxide film (not shown). In short, the cell has a CMOS structure in which NMOS and PMOS are combined together. To the source 43 and the drain 46, a voltage Ve is applied from a power supply 51, and the source 45 and the drain 46 are grounded. The NMOS portion serves as a reading transistor, whereas the PMOS portion serves as a control gate portion. It should be noted that the reference numeral 52 is a high-concentration region which serves to make the ground characteristics excellent.

In the above-described 1-poly-type EPROM structure, the gate couple ratio depends upon the implantation amount of the threshold value ion implantation, the thickness of the gate oxide film, and the ratio between the area in which the floating gate and the active region overlap in the control gate portion (PMOS) and the area in which the floating gate and the active region overlap in the reading transistor (NMOS) (to be called the area ratio between the active regions hereinafter). Therefore, by changing these values the gate couple ratio can be varied, and therefore the threshold value can be changed.

With the above-described constitution, in the cases of the technique of changing the threshold value ion implantation and the technique of changing the thickness of the gate oxide film, the number of steps is increased, whereas in the case of the technique of changing the area ratio between the active regions, the number of steps is not increased. Therefore, the area ratio changing technique is preferable. More specifically, the area ratio of the active regions can be changed in steps by varying the areas of the PMOS and NMOS channel regions (gate oxide film area) in the element separation region formation step or varying the area of the floating gate in the floating gate formation step. For changing these areas, a simple technique of improving the photomask as in the above-described example, without increasing the number of steps, is sufficient.

It is obvious that a reference cell thus manufactured has a good compatibility with regard to the logic device. For example, such reference cells and the logic device can be manufactured at one time in the same process.

The reference apparatus of the present invention can be used for a logic device in the following manners. That is, in the case where outputs from a logic circuit or the block thereof are determined in terms of, for example, three levels, an output destination is changed to another in accordance with output levels $I_{d1}$, $I_{d2}$ and $I_{d3}$, or, with regard to circuits A and B having different output levels, the present invention may be used for the circuit A as a reference to check $I_{d1}-I_2$, and the circuit B as a reference to check $I_{d3}-I_{d2}$. Thus, the present invention can be applied to various versions in accordance with the purpose. Further, the present invention, which is based on the 1-poly-type EPROM structure, is not limited to the CMOS structure, but any type of the structure known as the 1-poly-type EPROM structure can be used in the present invention.

Another embodiment of the present invention will now be described.

Figure 14:
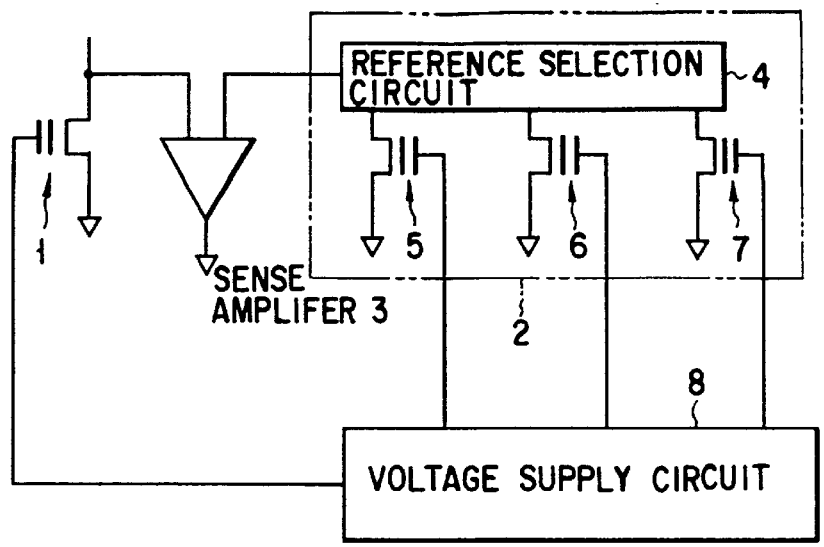
FIG. 14 is a diagram showing a state in which the reference cells of the reference apparatus shown in FIG. 1 and the memory cells are connected to a voltage supply circuit for supplying voltages to these cells.

FIG. 14 shows the state in which each of the reference cells and memory cells of the reference apparatus shown in FIG. 1 is connected to the voltage supply circuit 8 which supplies a voltage to each cell.

The operation of confirming the threshold value of a memory cell after programming or erasing in the nonvolatile semiconductor memory device such as a flash memory, is generally called "verification".

Figure 15:
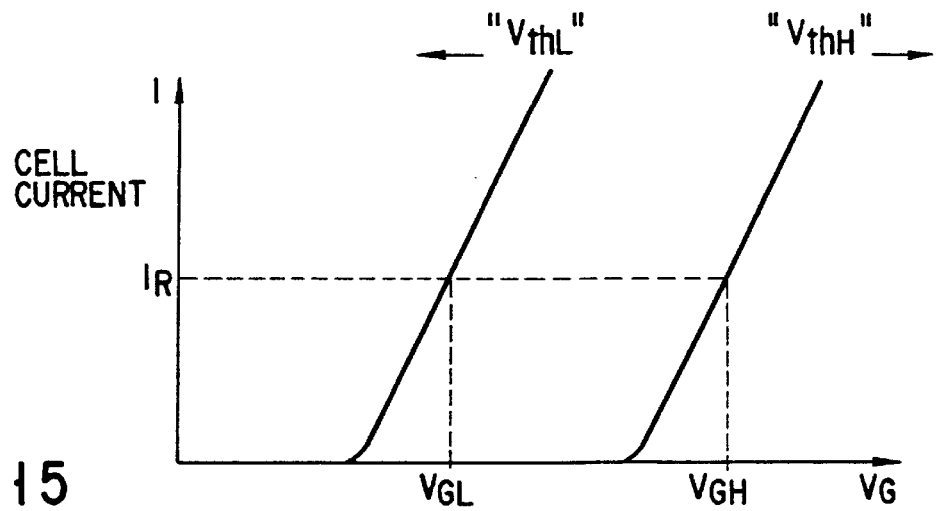
FIG. 15 is a diagram showing a verifying status of a general memory cell.

In a memory cell, a verification is performed generally with a sufficient margin for the states in which the threshold value is high ($V_{thH}$) and low ($V_{thL}$), and therefore the voltage (verifying voltage) applied to the gate of the memory cell for verification, is changed in accordance with the state to be verified. More specifically, as shown in FIG. 15, for verification of $V_{thH}$, the verifying voltage $V_{GH}$ is applied, whereas for verification of $V_{THL}$, a verifying voltage $V_{GL}$ is applied. It should be noted here that $V_{GH}$ is larger than $V_{GL}$.

In a reference cell, a constant voltage $V_R$ is applied regardless of the state to be verified, and a cell current $I_R$ which serves as a reference for the determined state, is allowed to flow more specifically, the verifying current is supplied to a memory cell after programing or erasing, and a current which flows in such a case is compared with $I_R$, thus performing the verification. The voltages $V_D$ applied to the drains of the memory cell and the reference cell are the same.

Figure 16:
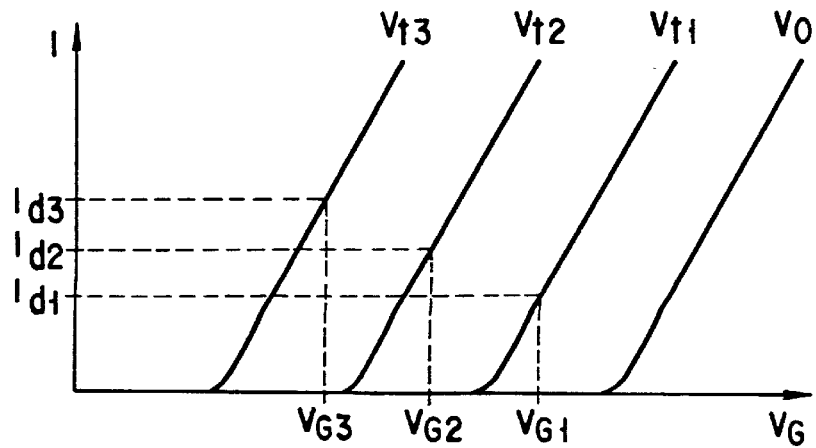
FIG. 16 is a diagram illustrating a general verifying status of the reference apparatus of the present invention.

In the case of the embodiment according to the reference apparatus, the verification is performed, as shown in FIG. 16, at the reference cell current $I_{dn}$ (n=1, 2, 3) with regard to the verifying voltage $V_{Gn}$ (n=1, 2, 3).

In the present invention, for the same $V_R$, the reference cells are different from each other in current value $I_{Rn}$. By utilizing such a feature, the verification can be carried out without setting a different verifying voltage for the state of each of the cells as can be seen in FIG. 17. More specifically, the verification is carried out by comparing the cell current of a memory cell at a verifying voltage $V_{GO}$ with the cell current of each reference cell. If $V_{GO}=V_R$, a plurality of threshold values can be verified by means of a single gate voltage. In other words, the difference in threshold value between reference cells is utilized as the difference in verifying voltage. In such a case, a plurality of verifying voltages may not be used, and therefore there is no need to provide a divider or dividers for the power supply circuit, thus making it possible to simplify the circuit structure.

Further, as can be seen in FIG. 18, by utilizing the above-described feature, a greater number of verifying states, namely, $V_{thL1}$, $V_{thL2}$, $V_{thL3}$, $V_{thH1}$, $V_{thH2}$ and $V_{thH2}$, can be created with use of the plurality of verifying voltages.

In this case, the verifying voltage applied to a memory cell is a voltage $V_{GL}$ or $V_{GH}$, whereas $V_R$ is applied to a reference cell.

It should be noted that a flash memory entails the problem of a tail bit. (See "'93 Symposium on VLSI Technology" pp 83–84.) Especially, a low threshold value cell, after electrons are extracted from the floating gate thereof, causes the problem of leakage or 10 the like. As countermeasures to such a problem, techniques including the program-back are presently proposed. "Program-back" is to make the distribution of threshold voltages of memory cells convergent by erasing information of the cells by F-N tunneling and thereafter injecting channel electron induced a valance hot carrier into the floating gate of the cells. (See IEDM 91–307, 11.4.1 to 11.4.4). However these techniques are not effective in the case of multi-value levels. Therefore, it is necessary to provide a technique for limiting the threshold values of memory cells within a narrow range in the verification. With the conventional method, the threshold value of a memory cell should be controlled for a number of voltage levels, for example, after the memory cell current for the verifying voltage $V_G$ is verified to be $I_R$ or higher, the memory cell current for the verifying voltage $V_G-\Delta(<V_G)$ is verified to be $I_R$ or less.

In contrast, with use of the reference apparatus of the present invention, the above-mentioned verifying operation will be further simplified. More specifically, the same effect as above can be achieved merely by switching reference cells without varying the verifying voltage. As is clear from FIG. 16, a different reference cell involves a different current level, and therefore the upper and lower limits of the memory level can be set simply by switching reference cells.

The above-described embodiments are directed to the case where the threshold value of a reference cell is set at three levels; however the present invention is not limited the above embodiments. In accordance with necessity, the threshold value can be set at a different number of levels. Further, the type of the reference cells is not limited to those discussed in the embodiments. In other words, in the above embodiments, a stacked gate type reference cell is used for a memory device, and a reference having the 1-poly-type EPROM structure is used for a logic device; however the present invention is not limited to these embodiments. The type of reference cell can be selected in order for an easy process design.

Further, in the above embodiments, devices having a plurality of threshold values are arranged in the same reference array; however reference blocks for different threshold levels can be formed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a reference apparatus for determining a current or voltage of a semiconductor device, including a plurality of reference cells having threshold values different from each other, and a selection circuit for selecting one of said plurality of reference cells, said method comprising the steps of:

forming a first insulation film on a main surface of a semiconductor substrate of a first conductivity type;

forming a first conductive film which gives rise to floating gates of the reference cells, on the first insulation film;

forming a floating gate of each of said reference cells by etching said first conductive film;

forming diffusion regions which give rise to drains and sources of said reference cells, in said main surface of said semiconductor substrate;

forming second insulation films between said floating gates;

forming second conductive films which give rise to conductive caps of the reference cells, on the floating gates and the second insulation films of the reference cells;

etching said second conductivity films by photolithography with use of a mask having a plurality of opening portions having different areas, which correspond to the conductive caps of the reference cells, thus forming conductive caps having different areas from one reference cell to another, so as to project from the floating gates;

forming a third insulation film on said second insulation films and said conductive caps; and forming a third conductive film which gives rise of control gates, on said third insulation film.

2. A method of manufacturing a reference apparatus for determining a current or voltage of a semiconductor device, including a plurality of reference cells having threshold values different from each other, and a selection circuit for selecting one of said plurality of reference cells, said method comprising the steps of:

forming a first insulation film on a main surface of a semiconductor substrate of a first conductivity type;

forming a first conductive film which gives rise to floating gates of the reference cells, on the first insulation film;

etching said first conductivity film by photolithography with use of a mask having a plurality of opening portions having different areas, which correspond to the floating gates of the reference cells, thus forming floating gates having different areas from one reference cell to another;

forming diffusion regions which give rise to drains and sources of the reference cells, in said main surface of said semiconductor substrate;

forming second insulation films between said floating gates;

forming third insulation films on said second insulation films and said floating gates; and forming a second conductive film which gives rise of control gates, on said third insulation film.

* * * * *